(12) United States Patent
Shah et al.

(10) Patent No.: US 10,688,538 B2
(45) Date of Patent: Jun. 23, 2020

(54) ALUMINUM FLUORIDE MITIGATION BY PLASMA TREATMENT

(71) Applicant: Applied Materials, Inc., Santa Clara, CA (US)

(72) Inventors: Vivek Bharat Shah, Sunnyvale, CA (US); Anup Kumar Singh, Santa Clara, CA (US); Bhaskar Kumar, Santa Clara, CA (US); Ganesh Balasubramanian, Sunnyvale, CA (US); Bok Hoen Kim, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/653,785

(22) Filed: Jul. 19, 2017

(65) Prior Publication Data

US 2018/0036775 A1 Feb. 8, 2018

Related U.S. Application Data

(60) Provisional application No. 62/371,568, filed on Aug. 5, 2016.

(51) Int. Cl.
*C23C 16/44* (2006.01)
*B08B 7/00* (2006.01)
(Continued)

(52) U.S. Cl.
CPC .......... *B08B 7/0035* (2013.01); *B08B 9/0865* (2013.01); *C23C 16/4405* (2013.01);
(Continued)

(58) Field of Classification Search
CPC . B08B 7/0035; B08B 9/0865; C23C 16/4405; C23C 16/50; C23C 16/505; H01J 37/32357; H01J 37/32862
See application file for complete search history.

(56) References Cited

U.S. PATENT DOCUMENTS 5,843,239 A * 12/1998 Shrotriya .............. B08B 7/0035
134/1.1
6,068,729 A    5/2000 Shrotriya
(Continued)

FOREIGN PATENT DOCUMENTS

EP       2196558 A1    6/2010
JP    2001-237237 A    8/2001
(Continued)

OTHER PUBLICATIONS

International Search Report and Written Opinion for International Application No. PCT/US2017/042621 dated Sep. 29, 2017.
(Continued)

*Primary Examiner* — Sharidan Carrillo
(74) *Attorney, Agent, or Firm* — Patterson + Sheridan, LLP

(57) ABSTRACT

Implementations described herein generally relate to methods and apparatus for in-situ removal of unwanted deposition buildup from one or more interior surfaces of a semiconductor substrate-processing chamber. In one implementation, the method comprises forming a reactive fluorine species from a fluorine-containing cleaning gas mixture. The method further comprises delivering the reactive fluorine species into a processing volume of a substrate-processing chamber. The processing volume includes one or more aluminum-containing interior surfaces having unwanted deposits formed thereon. The method further comprises permitting the reactive fluorine species to react with the unwanted deposits and aluminum-containing interior surfaces of the substrate-processing chamber to form aluminum fluoride. The method further comprises exposing nitrogen-containing cleaning gas mixture to in-situ plasma to form reactive nitrogen species in the processing volume. The method further comprises permitting the reactive nitro-
(Continued)

gen species to react with the ammonium fluoride to convert the aluminum fluoride to aluminum nitride.

20 Claims, 3 Drawing Sheets

(51) Int. Cl.
  *H01J 37/32* (2006.01)
  *C23C 16/505* (2006.01)
  *B08B 9/08* (2006.01)
  *C23C 16/50* (2006.01)

(52) U.S. Cl.
  CPC .......... *C23C 16/50* (2013.01); *C23C 16/505* (2013.01); *H01J 37/32357* (2013.01); *H01J 37/32862* (2013.01)

(56) References Cited

U.S. PATENT DOCUMENTS

| | | | |
|---|---|---|---|
| 8,075,789 | B1 | 12/2011 | Littau et al. |
| 9,275,834 | B1 | 3/2016 | Park et al. |
| 2003/0192568 | A1* | 10/2003 | Zheng .................. B08B 7/00 134/1.1 |
| 2005/0139578 | A1 | 6/2005 | Fukuda et al. |
| 2006/0090700 | A1* | 5/2006 | Satoh .................. C23C 16/4405 118/715 |
| 2006/0151002 | A1* | 7/2006 | Kumar .................. B08B 7/0035 134/1.1 |
| 2006/0213539 | A1 | 9/2006 | Hasebe et al. |
| 2007/0028944 | A1 | 2/2007 | Sawin et al. |
| 2007/0207275 | A1 | 9/2007 | Nowak et al. |
| 2008/0041308 | A1 | 2/2008 | Hong et al. |
| 2012/0238103 | A1 | 9/2012 | Zhang et al. |
| 2013/0065402 | A1 | 3/2013 | Kameda et al. |
| 2014/0053867 | A1 | 2/2014 | Fang et al. |
| 2015/0047680 | A1 | 2/2015 | Umezaki et al. |
| 2015/0376780 | A1* | 12/2015 | Khaja ................. C23C 16/4405 134/1.1 |
| 2017/0207069 | A1* | 7/2017 | Bhatia ....................... B08B 5/00 |
| 2017/0323768 | A1* | 11/2017 | Zhang ............... H01J 37/32082 |
| 2017/0365450 | A1* | 12/2017 | Bi ..................... H01J 37/32862 |
| 2018/0036775 | A1* | 2/2018 | Shah .................... B08B 7/0035 |

FOREIGN PATENT DOCUMENTS

| | | |
|---|---|---|
| JP | 4845455 B2 | 12/2011 |
| KR | 20050109046 A | 11/2005 |
| KR | 1020050109046 A | 11/2005 |
| KR | 10-0794661 B1 | 1/2008 |
| KR | 20080050402 A | 6/2008 |
| KR | 1020080050402 A | 6/2008 |
| KR | 1020130029360 A | 3/2013 |
| KR | 1020140124858 A | 10/2014 |

OTHER PUBLICATIONS

Office Action for Korean Application No. 10-2017-0098590 dated Oct. 19, 2018.

Office Action for Korean Application No. 10-2017-0098590 dated Apr. 29, 2019.

* cited by examiner

US 10,688,538 B2

ALUMINUM FLUORIDE MITIGATION BY PLASMA TREATMENT

CROSS-REFERENCE TO RELATED APPLICATIONS

This application claims benefit of U.S. Provisional Patent Application Ser. No. 62/371,568, filed Aug. 5, 2016, which is incorporated herein by reference in its entirety.

BACKGROUND

Field

Implementations described herein generally relate to methods and apparatus for in-situ removal of unwanted deposition buildup from one or more interior surfaces of a semiconductor substrate-processing chamber.

Description of the Related Art

Unwanted deposition of materials on the interior surfaces such as the walls and chamber parts of plasma-enhanced chemical vapor deposition (PECVD) processing chambers may occur during deposition processes. Such unwanted deposition may create particles and flakes within the chamber, resulting in the drift of process conditions and more importantly affecting process reproducibility and uniformity.

In order to achieve high chamber availability while reducing the cost of ownership for production and maintaining film quality, a chamber clean is typically used to remove material residue from the interior surfaces of the processing chamber including the wall and process kits, e.g., showerhead, etc. Unfortunately, most current chamber cleaning processes adversely affect the interior surfaces of the processing chamber resulting in the production of additional particles and flakes.

Therefore, a need exists for methods for removing unwanted deposits from substrate-processing chambers without adversely affecting the interior surfaces of the substrate-processing chambers.

SUMMARY

Implementations described herein generally relate to methods and apparatus for in-situ removal of unwanted deposition buildup from one or more interior surfaces of a semiconductor substrate-processing chamber. In one implementation, a method for cleaning a substrate-processing chamber is provided. The method comprises forming a reactive fluorine species from a fluorine-containing cleaning gas mixture. The method further comprises delivering the reactive fluorine species into a processing volume of a substrate-processing chamber. The processing volume includes one or more aluminum-containing interior surfaces having unwanted deposits formed thereon. The method further comprises permitting the reactive fluorine species to react with the unwanted deposits and aluminum-containing interior surfaces of the substrate-processing chamber to form aluminum fluoride. The method further comprises exposing nitrogen-containing cleaning gas mixture to in-situ plasma to form reactive nitrogen species in the processing volume. The method further comprises permitting the reactive nitrogen species to react with the aluminum fluoride to aluminum nitride.

In another implementation, a method for cleaning a substrate-processing chamber is provided. The method comprises flowing a fluorine-containing cleaning gas mixture into a remote plasma source fluidly coupled with a substrate-processing chamber. The substrate-processing chamber has a processing volume with one or more aluminum-containing interior surfaces having unwanted deposits formed on the one or more aluminum-containing interior surfaces. The method further comprises forming reactive fluorine species from the fluorine-containing cleaning gas mixture and transporting the reactive fluorine species into the processing volume. The method further comprises permitting the reactive fluorine species to react with the unwanted deposits and aluminum-containing interior surfaces of the substrate-processing chamber to form aluminum fluoride. The method further comprises flowing a nitrogen-containing cleaning gas mixture into the processing volume and exposing the nitrogen-containing cleaning gas mixture to in-situ plasma to form reactive nitrogen species. The method further comprises permitting the reactive nitrogen species to react with the aluminum fluoride to convert the aluminum fluoride to aluminum nitride.

In yet another implementation, a method for cleaning a substrate-processing chamber is provided. The method comprises flowing a fluorine-containing cleaning gas mixture into a remote plasma source fluidly coupled with a substrate-processing chamber. The substrate-processing chamber has a processing volume with one or more aluminum-containing interior surfaces including a heater pedestal having unwanted dielectric deposits formed thereon. The method further comprises heating the substrate-processing chamber to a temperature within a range from about 300 degrees Celsius to about 650 degrees Celsius. The method further comprises forming reactive fluorine species from the fluorine-containing cleaning gas mixture and transporting the reactive fluorine species into the processing volume. The method further comprises permitting the reactive fluorine species to react with the unwanted dielectric deposits and aluminum-containing interior surfaces of the substrate-processing chamber to form aluminum fluoride. The method further comprises flowing a nitrogen-containing cleaning gas mixture into the processing volume and exposing the nitrogen-containing cleaning gas mixture to in-situ plasma to form reactive nitrogen species. The method further comprises permitting the reactive nitrogen species to react with the aluminum fluoride to convert the aluminum fluoride to aluminum nitride.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
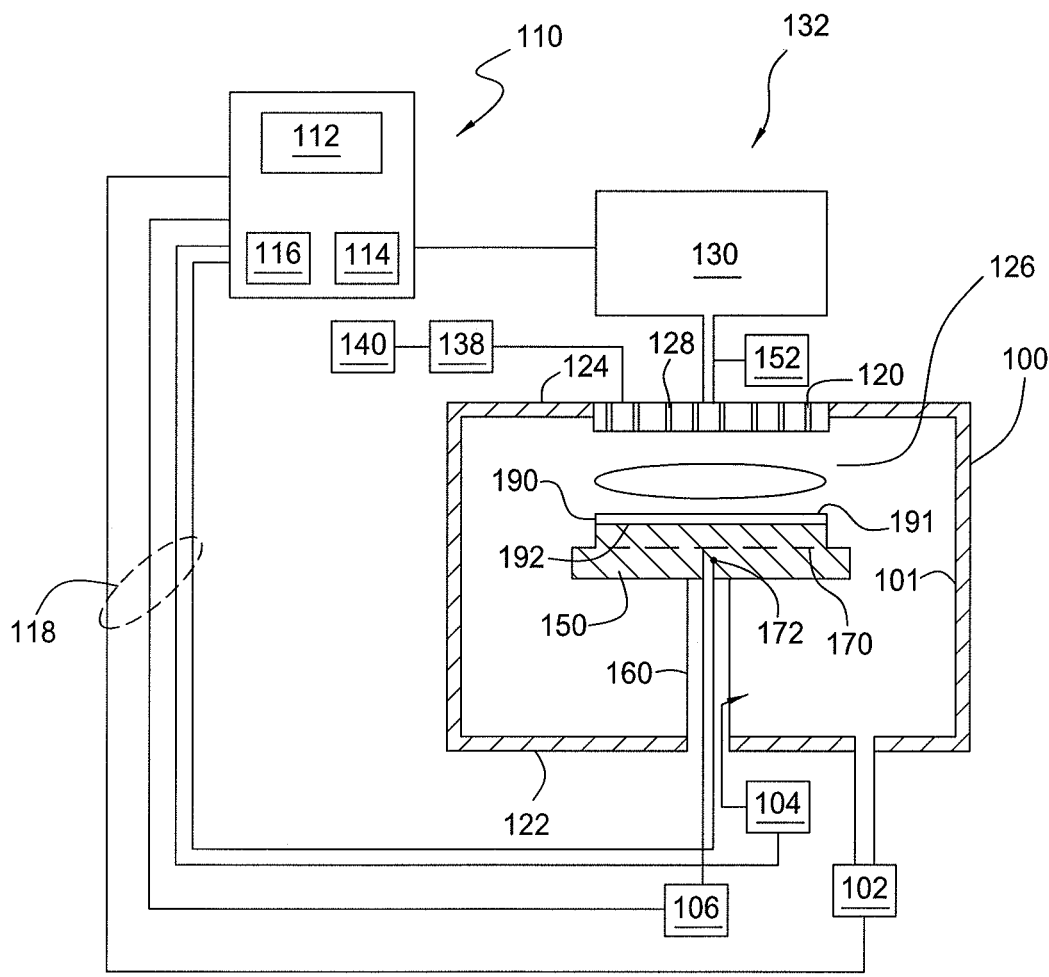
FIG. 1 depicts a schematic illustration of a deposition processing system that can be used for the practice of implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes techniques for removal of ammonium fluoride from a substrate-processing chamber. Certain details are set forth in the following description and in FIGS. 1, 2A, and 2B to provide a thorough understanding of various implementations of the disclosure. Other details describing well-known structures and systems often associated with plasma deposition and ammonium fluoride removal are not set forth in the following disclosure to avoid unnecessarily obscuring the description of the various implementations.

Many of the details, dimensions, angles, and other features shown in the Figures are merely illustrative of particular implementations. Accordingly, other implementations can have other details, components, dimensions, angles, and features without departing from the spirit or scope of the present disclosure. In addition, further implementations of the disclosure can be practiced without several of the details described below.

Implementations described herein will be described below in reference to a PECVD process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, and PRODUCER® SE™ systems which are commercially available from Applied Materials, Inc., of Santa Clara, Calif. Other tools capable of performing PECVD processes may also be adapted to benefit from the implementations described herein. In addition, any system enabling the PECVD processes described herein can be used to advantage. The apparatus description described herein is illustrative and should not be construed or interpreted as limiting the scope of the implementations described herein.

Unwanted deposition of materials (e.g., dielectric materials) on the interior aluminum-containing surfaces such as the walls and chamber parts of plasma-enhanced chemical vapor deposition (PECVD) processing chambers may occur during deposition processes. Such unwanted deposition may create particles and flakes within the chamber, resulting in the drift of process conditions and more importantly affecting process reproducibility and uniformity.

In order to achieve high chamber availability while reducing the cost of ownership for production and maintaining film quality, a chamber clean is typically used to remove material residue from the aluminum-containing interior surfaces of the processing chamber including the wall and process kits, e.g., showerhead, etc. Currently, reactive fluorine-species (e.g., fluorine radicals) are used to remove unwanted deposits. Unfortunately, most current chamber cleaning processes adversely affect the interior surfaces of the processing chamber resulting in the production of additional particles and flakes. For example, during fluorine radical cleaning, the fluorine radicals attach to the aluminum-containing surfaces (e.g., aluminum nitride surface) of the heater and convert the aluminum nitride to aluminum fluoride. Generally, the aluminum fluoride deposits start to sublime at about 480 degrees Celsius. Then, the aluminum fluoride condenses and forms a layer on the faceplate/showerhead. The aluminum fluoride deposits can flake off and fall down on the wafer during process adversely affecting the yield. Hence, aluminum fluoride particles (defects) on the wafer have very tight specification since they affect the yield significantly. Moreover, with ever tightening specification for particles it is better to have no aluminum fluoride on the heater or faceplate.

Implementations of the present disclosure, convert the aluminum fluoride on the heater to other compounds in a plasma environment. The aluminum fluoride is converted into non-volatile compounds such as aluminum nitride or aluminum oxide, which will not create problems in high temperature wafer processing.

FIG. 1 depicts a schematic illustration of a substrate-processing system 132 that can perform the in-situ removal of unwanted deposition in accordance with implementations described herein. The substrate-processing system 132 includes a substrate-processing chamber 100 coupled to a gas panel 130 and a controller 110. The substrate-processing chamber 100 generally includes a top wall 124, a sidewall 101 and a bottom wall 122 that define a processing volume 126. A support pedestal 150 is provided in the processing volume 126 of the substrate-processing chamber 100. The support pedestal 150 is supported by a pedestal stem 160 and may be typically fabricated from aluminum, ceramic, and other suitable materials. The support pedestal 150 may be moved in a vertical direction inside the substrate-processing chamber 100 using a displacement mechanism (not shown).

The support pedestal 150 may include a heater element 170 suitable for controlling the temperature of a substrate 190 supported on a surface 192 of the support pedestal 150. In one implementation, the heater element 170 is embedded in the support pedestal 150. The support pedestal 150 may be resistively heated by applying an electric current from a power supply 106 to the heater element 170. The heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thus maintaining the substrate 190 and the support pedestal 150 at a substantially constant temperature during film deposition. The supplied electric current may be adjusted to selectively control the temperature of the support pedestal 150 between about 100 degrees Celsius to about 700 degrees Celsius.

A temperature sensor 172, such as a thermocouple, may be embedded in the support pedestal 150 to monitor the temperature of the support pedestal 150 in a conventional manner. The measured temperature is used by the controller 110 to control the power supplied to the heater element 170 to maintain the substrate at a chosen temperature.

A vacuum pump 102 is coupled to a port formed in the bottom of the substrate-processing chamber 100. The vacuum pump 102 is used to maintain a chosen gas pressure in the substrate-processing chamber 100. The vacuum pump 102 also evacuates post-processing gases and by-products of the process from the substrate-processing chamber 100.

The substrate-processing system 132 may further include additional equipment for controlling the chamber pressure, for example, valves (e.g. throttle valves and isolation valves) positioned between the substrate-processing chamber 100 and the vacuum pump 102 to control the chamber pressure.

The substrate-processing system 132 may further include a purge gas source 104 for supplying a purge gas to the processing volume 126.

A showerhead 120 having a plurality of apertures 128 is disposed on the top of the substrate-processing chamber 100 above the support pedestal 150. The apertures 128 of the showerhead 120 are utilized to introduce process gases into the substrate-processing chamber 100. The apertures 128 may have different sizes, number, distributions, shape, design, and diameters to facilitate the flow of the various process gases for different process requirements. The showerhead 120 is connected to the gas panel 130 that allows various gases to supply to the processing volume 126 during process. Plasma is formed from the process gas mixture exiting the showerhead 120 to enhance thermal decomposition of the process gases resulting in the deposition of material on a surface 191 of the substrate 190.

The showerhead 120 and the support pedestal 150 may form a pair of spaced apart electrodes in the processing volume 126. One or more RF power sources 140 provide a bias potential through a matching network 138 to the showerhead 120 to facilitate generation of plasma between the showerhead 120 and the support pedestal 150. Alternatively, the RF power sources 140 and matching network 138 may be coupled to the showerhead 120, the support pedestal 150, or coupled to both the showerhead 120 and the support pedestal 150, or coupled to an antenna (not shown) disposed exterior to the substrate-processing chamber 100. In one implementation, the RF power sources 140 may provide between about 100 Watts and about 3,000 Watts at a frequency of about 50 kHz to about 13.6 MHz. In another implementation, the RF power sources 140 may provide between about 500 Watts and about 1,800 Watts at a frequency of about 50 kHz to about 13.6 MHz. In some implementations, plasma is supplied to the processing volume 126 via a remote plasma source 152.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the substrate-processing system 132 are handled through numerous signal cables collectively referred to as signal buses 118, some of which are illustrated in FIG. 1.

Other deposition chambers may also benefit from the present disclosure and the parameters listed above may vary according to the particular deposition chamber used to form the amorphous carbon layer. For example, other deposition chambers may have a larger or smaller volume, requiring gas flow rates that are larger or smaller than the gas flow rates recited for deposition chambers available from Applied Materials, Inc.

In some implementations, the flow rates in the present disclosure are expressed as standard cubic centimeters per minute ("sccm") per interior chamber volume. The interior chamber volume is defined as the volume of the interior of the chamber in which a gas can occupy. For example, the interior chamber volume of substrate-processing chamber 100 is the volume defined by the sidewall 101, bottom wall 122, and top wall 124 minus the volume occupied therein by the showerhead 120 and by the support pedestal 150/pedestal stem 160.

Figure 2A:
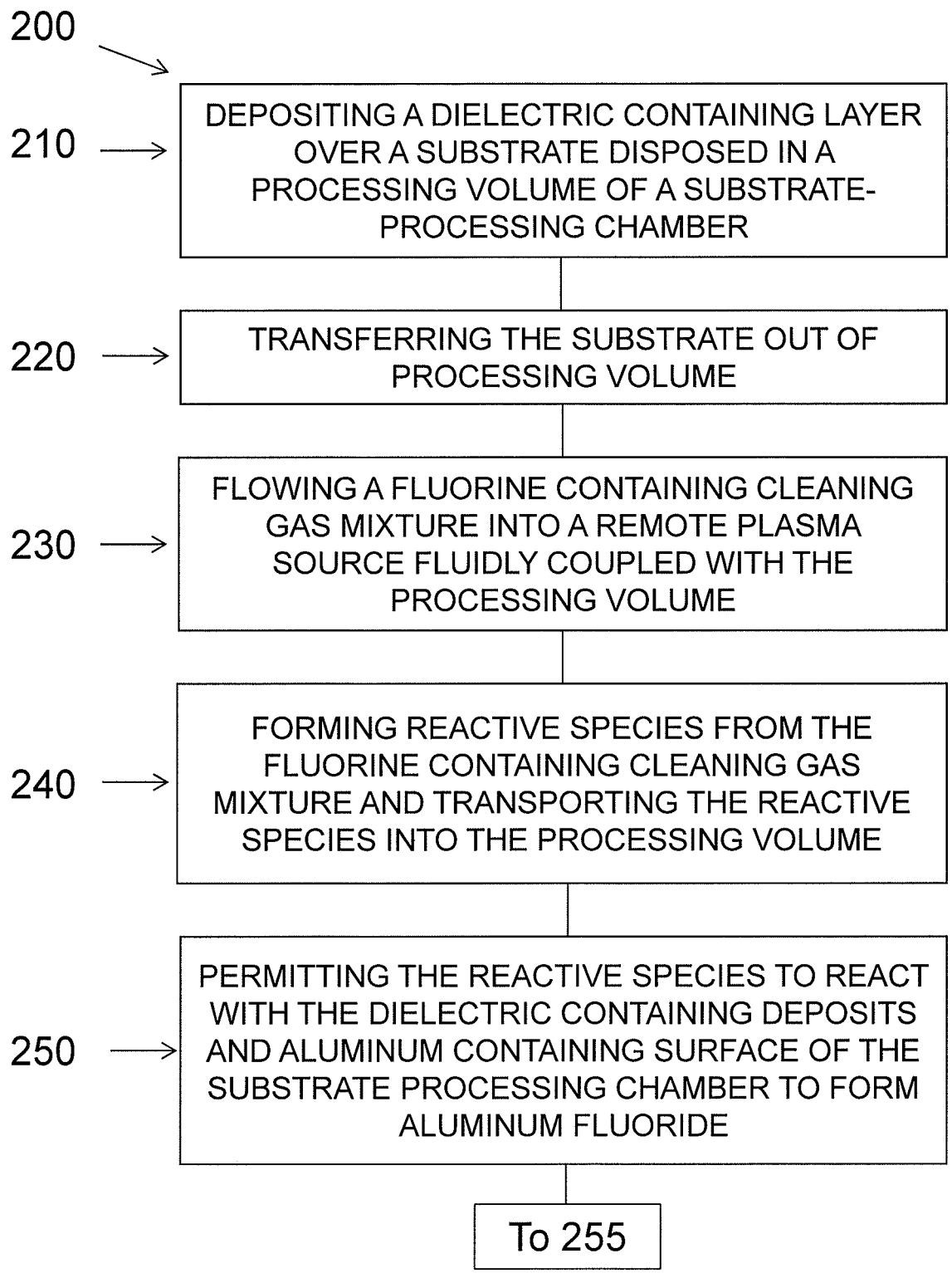
FIG. 2A depicts a process flow diagram depicting one implementation of a method that may be used to clean a deposition processing system according to implementations described herein.
Figure 2B:
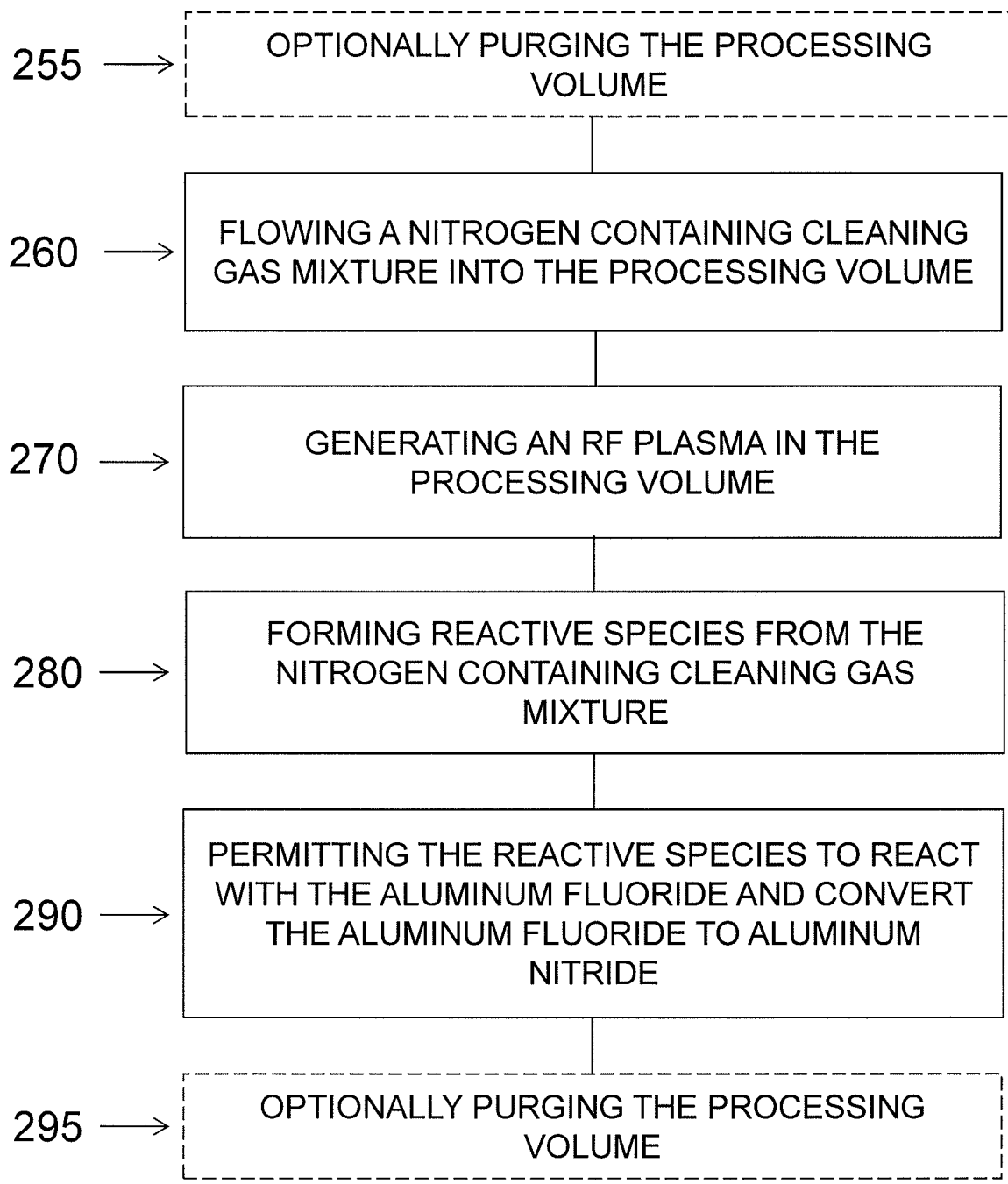
FIG. 2B depicts a process flow diagram, which is a continuation of the process flow diagram of FIG. 2A according to implementations described herein.

FIG. 2A is a process flow diagram depicting one implementation of a method 200 that may be used to clean a deposition processing system according to implementations described herein. FIG. 2B depicts a process flow diagram, which is a continuation of the process flow diagram of FIG. 2A according to implementations described herein. The deposition substrate-processing system may be a PECVD system similar to the substrate-processing system 132 depicted in FIG. 1. At operation 210, a dielectric-containing layer is deposited over a substrate disposed in a processing volume of a substrate-processing chamber. The substrate may be similar to substrate 190. Exemplary dielectric-containing layers include, but are not limited to, silicon oxides, silicon nitrides, and silicon oxynitrides. During deposition of the dielectric-containing layer over the substrate, dielectrics and/or dielectric-containing compounds may be deposited over the interior surfaces including the chamber components of the substrate-processing chamber. In one implementation, the interior surfaces include, for example, the chamber walls (e.g., sidewall 101, bottom wall 122 and top wall 124), the support pedestal (e.g., support pedestal 150), and the showerhead (e.g., showerhead 120). In one implementation, the interior surfaces of the substrate-processing chamber include aluminum-containing surfaces. At operation 220, the substrate is transferred out of the substrate-processing chamber.

Next, an optional chamber heating process may be performed prior to and/or during the chamber cleaning process. In one implementation, the chamber may be heated and/or maintained at a temperature within a range from about 300 degrees Celsius to about 650 degrees Celsius (e.g., from about 300 degrees Celsius to about 550 degrees Celsius; from about 300 degrees Celsius to about 400 degrees Celsius; or from about 400 degrees Celsius to about 550 degrees Celsius). Controlling the temperature may be used to control the removal/etching rate of the dielectric/dielectric-containing deposits. The removal rate may increase as the chamber temperature increases. For example, in some implementations, elevating the temperature to 400 degrees Celsius may increase the etching rate to 50 Å/second. In some implementations, the process chamber is heated by heating any of the walls of the process chamber (e.g., sidewall 101, bottom wall 122, and/or top wall 124), the heater pedestal (e.g., support pedestal 150), and/or the showerhead (e.g., showerhead 120). In some implementations, the substrate-processing chamber 100 is heated by heating the heater pedestal positioned in the chamber. The heater pedestal may be similar to the support pedestal 150. In some implementations, the chamber is heated by heating both the walls and the heater pedestal. In some implementations, the chamber is heated by in-situ plasma. In some implementations, the temperature of the process chamber may be maintained at the same temperature used during deposition of the dielectric-containing layer over the substrate.

At operation 230, a fluorine-containing cleaning gas mixture is flowed into a remote plasma source (e.g., remote plasma source 152) fluidly coupled with the processing volume. The fluorine-containing cleaning gas mixture comprises a fluorine-containing gas, an optional oxygen-containing gas and an optional inert gas. In some implementations, the optional inert gas functions as a carrier gas. In some implementations, the optional inert gas may extend the lifetime of and increase the density of the radical species. In some implementations, the fluorine-containing cleaning gas mixture is flowed into the remote plasma source and the other process gases are delivered to the chamber separately.

The fluorine-containing gas may be selected from the group consisting of: $NF_3$, $ClF_3$, $F_2$, $CF_4$, $O_2F_6$, and combinations thereof. The oxygen-containing gas may be selected from the group consisting of: $N_2O$, $O_2$, and combinations thereof. The optional inert gas may be selected from the group consisting of: helium, argon, and combinations thereof. In some implementations, the fluorine-containing cleaning gas mixture comprises $NF_3$ and $N_2O$. In some implementations, the fluorine-containing cleaning gas mixture comprises $NF_3$ and $O_2$.

The remote plasma source may be an inductively coupled plasma source. The remote plasma source accepts the fluorine-containing cleaning gas mixture and forms plasma in the fluorine-containing cleaning gas mixture, which causes dissociation of the fluorine-containing cleaning gas mixture to form cleaning radicals. The cleaning radicals may include reactive species such as F atoms or $F^+$ atoms. The remote plasma source provides high efficiency dissociation of the fluorine-containing cleaning gas mixture. In some implementations, a dissociation of the fluorine-containing cleaning gas mixture of greater than 90% is achieved. In some implementations, a dissociation of the fluorine-containing cleaning gas mixture of greater than 40%, greater than 60% or greater than 80% is achieved.

In some implementations, the remote plasma is initiated with an initial flow of argon or similar inert gas before introducing the fluorine-containing cleaning gas mixture into the remote plasma chamber.

The fluorine-containing cleaning gas mixture may be flowed into the remote plasma source at a flow rate of about 100 sccm to about 10,000 sccm. In some implementations, the fluorine-containing cleaning gas mixture is flowed into the remote plasma source at a flow rate from about 500 sccm to about 6,000 sccm. In some implementations, the fluorine-containing cleaning gas mixture is flowed into the remote plasma source at a flow rate from about 500 sccm to about 4,000 sccm. In some implementations, the fluorine-containing cleaning gas mixture is flowed into the remote plasma source at a flow rate of about 1,000 sccm.

In some implementations, the remote plasma is initiated with an initial flow of argon or similar inert gas before introducing $NF_3$ into the remote plasma chamber. Then, as $NF_3$ is introduced into the remote plasma chamber, the flow rate of argon is decreased. As an example, the remote plasma may be initiated with a flow of 3,000 sccm of argon which is progressively decreased to 1,000 and then to 500 sccm as $NF_3$ is introduced into the remote plasma chamber at an initial flow rate of 1,000 sccm and then increased to a flow of 1,500 sccm.

At operation 240, reactive species formed from the fluorine-containing gas mixture are transported to the processing volume. The reactive species include atomic fluorine.

The pressure within the processing volume may be between about 10 mTorr and about 300 Torr. The pressure within the processing volume may be between 1 Torr and about 10 Torr, for example, about 3 Torr.

In some implementations, the heater pedestal may be heated and/or maintained at a temperature within a range from about 300 degrees Celsius to about 650 degrees Celsius (e.g., from about 300 degrees Celsius to about 550 degrees Celsius; from about 300 degrees Celsius to about 400 degrees Celsius; or from about 400 degrees Celsius to about 550 degrees Celsius). In some implementations, during the cleaning process, the chamber walls may be heated and/or maintained at a temperature within a range from about 300 degrees Celsius to about 650 degrees Celsius (e.g., from about 300 degrees Celsius to about 550 degrees Celsius; from about 300 degrees Celsius to about 400 degrees Celsius; or from about 400 degrees Celsius to about 550 degrees Celsius). In some implementations, the process chamber may be heated to the aforementioned temperatures by heating any of the walls of the process chamber (e.g., sidewall 101, bottom wall 122, and/or top wall 124), the heater pedestal (e.g., support pedestal 150), and/or the showerhead (e.g., showerhead 120).

At operation 250, the reactive species react with the dielectric-containing deposits and aluminum-containing surfaces of the substrate-processing chamber. The reactive fluorine species react with the aluminum-containing surface to form aluminum fluoride.

Optionally, at operation 255, the processing volume is purged to remove contaminants from the substrate-processing chamber. In one implementation, the substrate-processing chamber is actively purged by flowing a purge gas into the substrate-processing chamber. Alternatively, or in addition to introducing the purge gas, the process chamber may be depressurized in order to remove the residual cleaning gas as well as any by-products from the processing chamber. The substrate-processing chamber may be purged by evacuating the substrate-processing chamber. The period of the purge process should generally be long enough to remove any residual cleaning gases and by-products from the substrate-processing chamber. The time of cleaning gas flow should be generally long enough to remove the dielectric deposits from the interior surfaces of the chamber including the chamber components.

At operation 260, a nitrogen-containing cleaning gas mixture is flowed into the processing volume of the substrate-processing chamber. The nitrogen-containing cleaning gas mixture comprises a nitrogen-containing gas, an optional oxygen-containing gas and an optional inert gas. In some implementations, the optional inert gas may function as a carrier gas. In some implementations, the optional inert gas may extend the lifetime of and increase the density of the radical species. In some implementations, the nitrogen-containing cleaning gas mixture is flowed into the processing volume and the other process gases are delivered to the chamber separately.

The nitrogen-containing gas may be selected from the group consisting of: $N_2$, $N_2O$, $NO_2$, $NH_3$, $N_2H_2$ and combinations thereof. The oxygen-containing gas may be selected from the group consisting of: $O_2$, $N_2O$, $NO_2$, $O_3$, $H_2O$, and combinations thereof. The optional inert gas may be selected from the group consisting of: helium, argon, and combinations thereof. In some implementations, the nitrogen-containing cleaning gas mixture comprises $N_2$. In some implementations, the nitrogen-containing cleaning gas mixture comprises $N_2$ and argon.

The nitrogen-containing cleaning gas mixture may be flowed into the chamber at a flow rate of about 100 sccm to about 10,000 sccm. In some implementations, the nitrogen-containing cleaning gas mixture is flowed into the chamber at a flow rate from about 500 sccm to about 4,000 sccm. In some implementations, the nitrogen-containing cleaning gas mixture is flowed into the chamber at a flow rate of about 1,000 sccm.

The pressure within the substrate-processing chamber may be between about 10 mTorr and about 100 Torr. The pressure within the substrate-processing chamber may be between 20 Torr and about 30 Torr, for example, about 25 Torr.

In some implementations, the heater pedestal may be heated and/or maintained at a temperature within a range from about 300 degrees Celsius to about 650 degrees Celsius (e.g., from about 300 degrees Celsius to about 550 degrees Celsius; from about 300 degrees Celsius to about 400 degrees Celsius; or from about 400 degrees Celsius to about 550 degrees Celsius). In some implementations, during the cleaning process, the chamber walls may be heated and/or maintained at a temperature within a range from about 300 degrees Celsius to about 650 degrees Celsius (e.g., from about 300 degrees Celsius to about 550 degrees Celsius; from about 300 degrees Celsius to about 400 degrees Celsius; or from about 400 degrees Celsius to about 550 degrees Celsius). In some implementations, the process chamber may be heated to the aforementioned temperatures by heating any of the walls of the process chamber (e.g., sidewall 101, bottom wall 122, and/or top wall 124), the heater pedestal (e.g., support pedestal 150), and/or the showerhead (e.g., showerhead 120).

The plasma may be formed by capacitive or inductive means, and may be energized by coupling RF power into the precursor gas mixture. The RF power may be a dual-frequency RF power that has a high frequency component and a low frequency component. The RF power is typically applied at a power level between about 50 W and about 2,500 W, which may be all high-frequency RF power, for example at a frequency of about 13.56 MHz, or may be a mixture of high-frequency power and low frequency power, for example at a frequency of about 300 kHz.

At operation 270, an in-situ RF plasma is generated in the processing volume. The plasma may be formed by capacitive or inductive means, and may be energized by coupling RF power into the precursor gas mixture. The RF power may be a dual-frequency RF power that has a high frequency component and a low frequency component. The RF power is typically applied at a power level between about 50 W and about 2,500 W, which may be all high-frequency RF power, for example at a frequency of about 13.56 MHz, or may be a mixture of high-frequency power and low frequency power, for example at a frequency of about 300 kHz.

At operation 280, reactive species are formed from the nitrogen-containing cleaning gas mixture in the processing volume.

At operation 290, the nitrogen reactive species are permitted to react with the aluminum fluoride and convert the aluminum fluoride to aluminum nitride.

Optionally, at operation 295, the processing volume is purged to remove contaminants from the substrate-processing chamber. The substrate-processing chamber may be actively purged by flowing a purge gas in the substrate-processing chamber. Alternatively, or in addition to introducing the purge gas, the process chamber may be depressurized in order to remove the residual cleaning gas as well as any by-products from the processing chamber. The substrate-processing chamber may be purged by evacuating the substrate-processing chamber. The period of the purge process should generally be long enough to remove any residual cleaning gases and by-products from the substrate-processing chamber. The time of cleaning gas flow should be generally long enough to remove the dielectric deposits from the interior surfaces of the chamber including the chamber components.

Any of operations 230, 240, 250, 255, 260, 270, 280, 290 and 295 may be repeated until a chosen cleaning endpoint is achieved. It should be understood that several cycles of cleaning might apply with an optional purge process performed in between cleaning cycles.

In summary, some of the benefits of the present disclosure provide a process that primarily uses nitrogen radicals generated through in-situ plasma to convert volatile aluminum fluoride deposits to non-volatile aluminum nitride and/or aluminum oxide. This ability to remove aluminum fluoride deposits allows for processing at higher temperature without sublimation and subsequent flaking of aluminum fluoride during wafer processing. Further, the methods of the present disclosure may be performed in-situ without the chamber downtime required by most ex-situ cleaning processes.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method for cleaning a substrate-processing chamber, consisting of:
    forming a reactive fluorine species from a fluorine-containing cleaning gas mixture in a remote plasma source;
    delivering the reactive fluorine species into a processing volume of a substrate-processing chamber, wherein the processing volume includes one or more aluminum-containing interior surfaces having unwanted deposits formed thereon;
    permitting the reactive fluorine species to react with the unwanted deposits and the aluminum-containing interior surfaces of the substrate-processing chamber to form aluminum fluoride;
    after forming the aluminum fluoride, exposing a nitrogen-containing cleaning gas mixture to an in-situ plasma to form reactive nitrogen species in the processing volume, wherein the nitrogen-containing cleaning gas mixture consists of:
        a nitrogen-containing cleaning gas; and
        optionally a first inert gas; and
    permitting the reactive nitrogen species to react with the aluminum fluoride to convert the aluminum fluoride to aluminum nitride, wherein the fluorine-containing cleaning gas mixture consists of:
        a fluorine-containing gas selected from the group consisting of: $NF_3$, $ClF_3$, $F_2$, or a combination thereof;
        an oxygen-containing gas selected from the group consisting of: $N_2O$, $O_2$, or a combination thereof; and
        optionally a second inert gas, wherein the unwanted deposits are selected from silicon oxides, silicon nitrides, silicon oxynitrides, or a combination thereof.

2. The method of claim 1, wherein the second inert gas is selected from the group consisting of: helium, argon, or a combination thereof.

3. The method of claim 1, wherein the fluorine-containing gas is $NF_3$ and the oxygen-containing gas is $N_2O$.

4. The method of claim 1, wherein the fluorine-containing gas is $NF_3$ and the oxygen-containing gas is $O_2$.

5. The method of claim 1, wherein the fluorine-containing gas is $F_2$.

6. The method of claim 1, wherein the remote plasma source is an inductively coupled plasma source.

7. The method of claim 1, wherein the nitrogen-containing cleaning gas consists of $N_2$, $N_2O$, $NO_2$, $NH_3$, $N_2H_2$, or a combination thereof.

8. A method for cleaning a substrate-processing chamber, consisting of:
flowing a fluorine-containing cleaning gas mixture into a remote plasma source fluidly coupled with a substrate-processing chamber, wherein the substrate-processing chamber has a processing volume with one or more aluminum-containing interior surfaces having unwanted deposits formed on the one or more aluminum-containing interior surfaces;
forming reactive fluorine species from the fluorine-containing cleaning gas mixture;
transporting the reactive fluorine species into the processing volume;
permitting the reactive fluorine species to react with the unwanted deposits and the one or more aluminum-containing interior surfaces of the substrate-processing chamber to form aluminum fluoride;
after forming the aluminum fluoride, flowing a nitrogen-containing cleaning gas mixture into the processing volume;
exposing the nitrogen-containing cleaning gas mixture to an in-situ plasma to form reactive nitrogen species, wherein the nitrogen-containing cleaning gas mixture consists of:
a nitrogen-containing cleaning gas; and
optionally a first inert gas;
permitting the reactive nitrogen species to react with the aluminum fluoride to convert the aluminum fluoride to aluminum nitride, wherein the fluorine-containing cleaning gas mixture consists of:
a fluorine-containing gas selected from the group consisting of: $NF_3$, $ClF_3$, $F_2$, or a combination thereof;
an oxygen-containing gas selected from the group consisting of: $N_2O$, $O_2$, or a combination thereof; and
optionally a second inert gas, wherein the unwanted deposits are selected from silicon oxides, silicon nitrides, silicon oxynitrides, or a combination thereof.

9. The method of claim 8, wherein the second inert gas is selected from the group consisting of: helium, argon, or a combination thereof.

10. The method of claim 8, wherein the fluorine-containing gas is $NF_3$ and the oxygen-containing gas is $N_2O$.

11. The method of claim 8, wherein the fluorine-containing gas is $NF_3$ and the oxygen-containing gas is $O_2$.

12. The method of claim 8, wherein the fluorine-containing gas is $F_2$.

13. The method of claim 8, wherein the remote plasma source is an inductively coupled plasma source.

14. The method of claim 8, wherein the nitrogen-containing cleaning gas consists of $N_2$, $N_2O$, $NO_2$, $NH_3$, $N_2H_2$, or a combination thereof.

15. A method for cleaning a substrate-processing chamber, consisting of:
flowing a fluorine-containing cleaning gas mixture into a remote plasma source fluidly coupled with a substrate-processing chamber, wherein the substrate-processing chamber has a processing volume with one or more aluminum-containing interior surfaces including a heater pedestal having unwanted dielectric deposits formed thereon;
heating the substrate-processing chamber to a temperature within a range from about 300 degrees Celsius to about 650 degrees Celsius;
forming reactive fluorine species from the fluorine-containing cleaning gas mixture;
transporting the reactive fluorine species into the processing volume;
permitting the reactive fluorine species to react with the unwanted dielectric deposits and the one or more aluminum-containing interior surfaces of the substrate-processing chamber to form aluminum fluoride;
after forming the aluminum fluoride, flowing a nitrogen-containing cleaning gas mixture into the processing volume;
exposing the nitrogen-containing cleaning gas mixture to an in-situ plasma to form reactive nitrogen species, wherein the nitrogen-containing cleaning gas mixture consists of:
a nitrogen-containing cleaning gas; and
optionally a first inert gas; and
permitting the reactive nitrogen species to react with the aluminum fluoride to convert the aluminum fluoride to aluminum nitride, wherein the fluorine-containing cleaning gas mixture consists of:
a fluorine-containing gas selected from the group consisting of: $NF_3$, $ClF_3$, $F_2$, or a combination thereof;
an oxygen-containing gas selected from the group consisting of: $N_2O$, $O_2$, or a combination thereof; and
optionally a second inert gas, wherein the unwanted dielectric deposits are selected from silicon oxides, silicon nitrides, silicon oxynitrides, or a combination thereof.

16. The method of claim 15, wherein the second inert gas is selected from the group consisting of: helium, argon, or a combination thereof.

17. The method of claim 15, wherein the fluorine-containing gas is $NF_3$ and the oxygen-containing gas is $N_2O$.

18. The method of claim 15, wherein the fluorine-containing gas is $NF_3$ and the oxygen-containing gas is $O_2$.

19. The method of claim 15, wherein the fluorine-containing gas is $F_2$.

20. The method of claim 15, wherein the remote plasma source is an inductively coupled plasma source.

* * * * *